US011297711B2

(12) United States Patent
Kawamura et al.

(10) Patent No.: US 11,297,711 B2
(45) Date of Patent: Apr. 5, 2022

(54) WIRING CIRCUIT BOARD AND PRODUCING METHOD THEREOF

(71) Applicant: NITTO DENKO CORPORATION, Osaka (JP)

(72) Inventors: Yoshihiro Kawamura, Osaka (JP); Shusaku Shibata, Osaka (JP); Hayato Takakura, Osaka (JP); Masaki Ito, Osaka (JP)

(73) Assignee: NITTO DENKO CORPORATION, Osaka (JP)

( * ) Notice: Subject to any disclaimer, the term of this patent is extended or adjusted under 35 U.S.C. 154(b) by 0 days.

(21) Appl. No.: 16/644,781

(22) PCT Filed: Sep. 5, 2018

(86) PCT No.: PCT/JP2018/032849
§ 371 (c)(1),
(2) Date: Mar. 5, 2020

(87) PCT Pub. No.: WO2019/054246
PCT Pub. Date: Mar. 21, 2019

(65) Prior Publication Data
US 2021/0084750 A1 Mar. 18, 2021

(30) Foreign Application Priority Data
Sep. 15, 2017 (JP) .............................. JP2017-177786

(51) Int. Cl.
*H05K 1/02* (2006.01)
*H05K 1/03* (2006.01)
*H05K 3/46* (2006.01)

(52) U.S. Cl.
CPC ......... *H05K 1/0216* (2013.01); *H05K 1/0346* (2013.01); *H05K 3/4644* (2013.01);
(Continued)

(58) Field of Classification Search
CPC ............. H01L 23/5384; H01L 2924/00; H01L 2924/0002; H01L 2924/09701;
(Continued)

(56) References Cited

U.S. PATENT DOCUMENTS 6,323,542 B1 * 11/2001 Hashimoto ......... H01L 23/3114
257/417
6,339,197 B1 * 1/2002 Fushie ................ H01L 23/5384
174/255

(Continued)

FOREIGN PATENT DOCUMENTS

JP      04165696 A   *  6/1992  ............ H01L 23/12
JP      H04-165696 A    6/1992
(Continued)

OTHER PUBLICATIONS

International Search Report Issued in PCT/JP2018/032849 dated Nov. 20, 2018.
(Continued)

*Primary Examiner* — Timothy J Thompson
*Assistant Examiner* — Guillermo J Egoavil
(74) *Attorney, Agent, or Firm* — Edwards Neils LLC; Jean C. Edwards, Esq.

(57) ABSTRACT

A wiring circuit board sequentially includes a conductive layer, an insulating layer, and a shield layer toward one side in a thickness direction. The insulating layer covers the conductive layer and has an insulating opening portion exposing a part of a one-side surface in the thickness direction of the conductive layer, and the shield layer has a recessed portion disposed at the inside of the insulating opening portion and recessed toward the other side in the thickness direction so as to be in contact with the conductive layer. The shield layer sequentially includes an adhesive layer and a main body layer toward one side in the thickness (Continued)

direction. A ratio (Tb/Ta) of a thickness Tb of the main body layer to a thickness Ta of the adhesive layer is 4 or more.

10 Claims, 5 Drawing Sheets

(52) U.S. Cl.
CPC ............... *H05K 2201/0154* (2013.01); *H05K 2201/0715* (2013.01)

(58) Field of Classification Search
CPC .. H05K 1/0216; H05K 1/0219; H05K 1/0346; H05K 1/056; H05K 1/115; H05K 1/02; H05K 1/03; H05K 1/0306; H05K 3/388; H05K 3/4644; H05K 3/46; H05K 3/426; H05K 3/4602; H05K 3/4605; H05K 3/467; H05K 2201/0154; H05K 2201/0338; H05K 2201/0344; H05K 2201/0715; H05K 2201/0179; H05K 2201/068; H05K 2201/09536; H05K 2201/0959; Y10T 29/49165; Y10T 428/24926
USPC .............. 174/251, 262, 255, 256, 261, 264; 361/792, 795, 803
See application file for complete search history.

(56) References Cited

U.S. PATENT DOCUMENTS

| 2008/0087455 | A1 | 4/2008 | Hu et al. | |
| 2009/0029506 | A1* | 1/2009 | Fujii | H01L 24/97 438/127 |
| 2013/0093948 | A1* | 4/2013 | Takeshita | G03B 17/02 348/374 |

FOREIGN PATENT DOCUMENTS

| JP | 11330692 A | * 11/1999 | ............... H05K 3/26 |
| JP | 2004349603 A | * 12/2004 | ............... H05K 3/46 |
| JP | 2008-091635 A | 4/2008 | |
| JP | 2009-278048 A | 11/2009 | |
| JP | 2009295850 A | * 12/2009 | ............. H01L 23/12 |
| JP | 2013-093506 A | 5/2013 | |
| JP | 5975364 B2 | 8/2016 | |

OTHER PUBLICATIONS

Written Opinion Issued in PCT/JP2018/032849 dated Nov. 20, 2018.
Office Action, issued by the Japanese Patent Office dated Aug. 17, 2021, in connection with Japanese Patent Application No. 2017-177786.

* cited by examiner

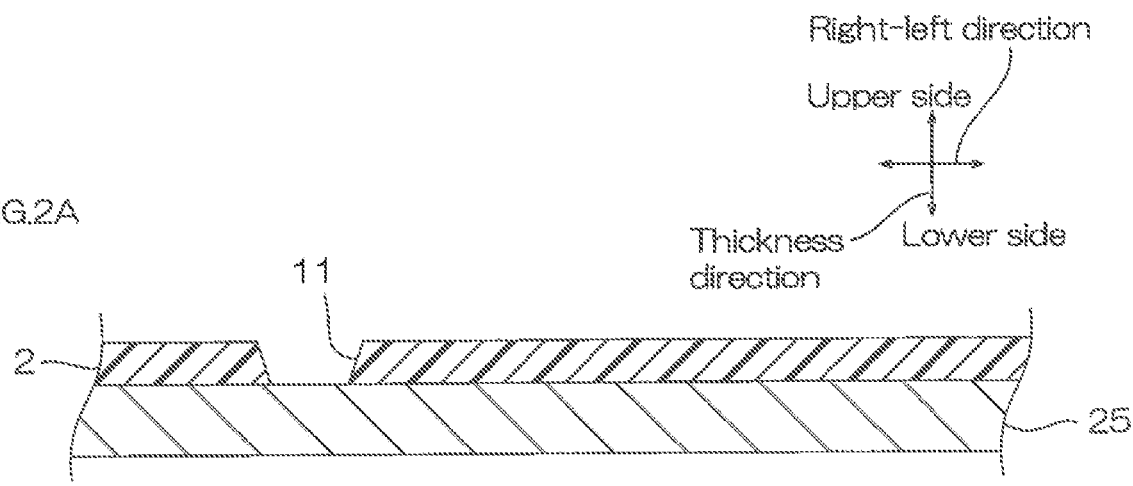
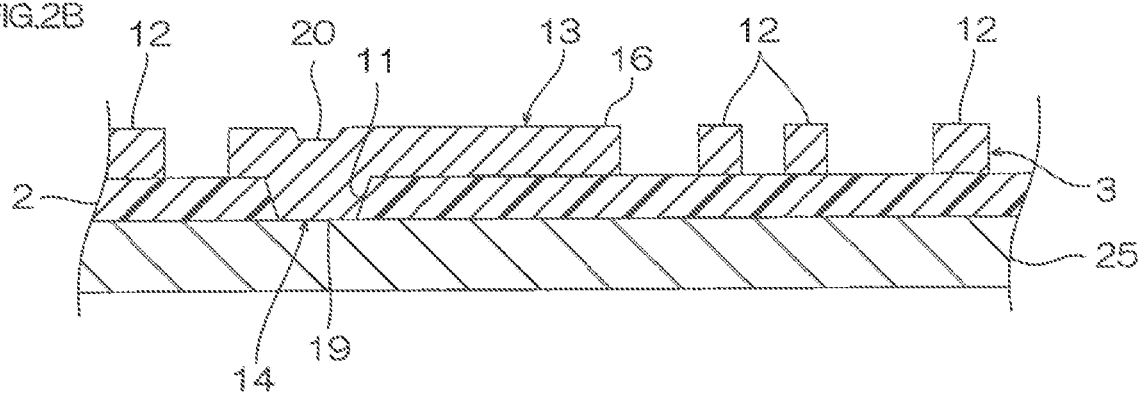
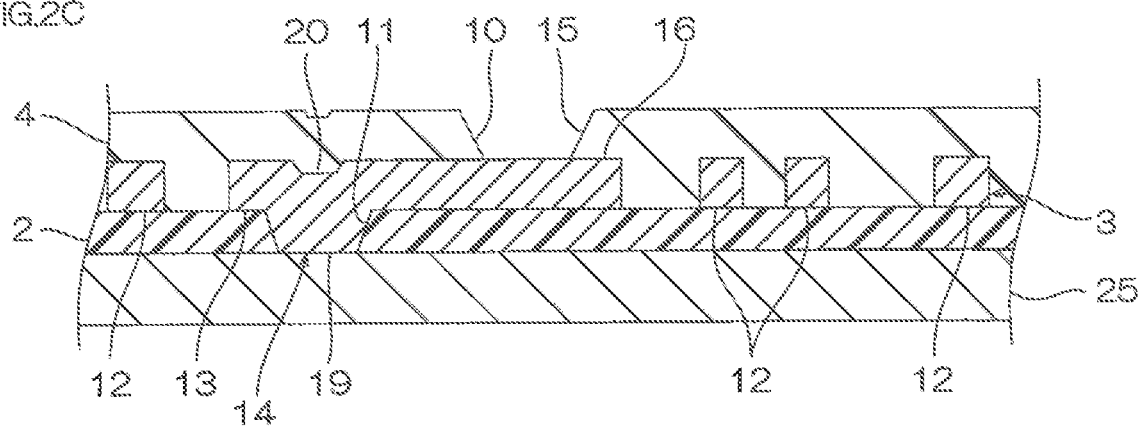

WIRING CIRCUIT BOARD AND PRODUCING METHOD THEREOF

CROSS-REFERENCE TO RELATED APPLICATIONS

The present application is a 35 U.S.C. 371 National Stage Entry of PCT/JP2018/032849, filed on Sep. 5, 2018, which claims priority from Japanese Patent Application No. 2017-177786, filed on Sep. 15, 2017, the contents of all of which are herein incorporated by reference in their entirety.

TECHNICAL FIELD

The present invention relates to a wiring circuit board and a producing method thereof.

BACKGROUND ART

Conventionally, a wiring circuit board including a ground layer and an insulating layer has been known (ref: for example, Patent Document 1).

In Patent Document 1, the ground layer includes a lower ground layer, a side ground wire filling an opening portion in an insulating layer and in contact with the lower ground layer, and an upper ground wire disposed on the upper surface of the insulating layer and uniformly formed with the side ground wire. The upper ground wire is electrically connected to the lower ground wire via the side ground wire and functions as a shield layer.

CITATION LIST

Patent Document

Patent Document 1: Japanese Unexamined Patent Publication No. 2008-91635

SUMMARY OF THE INVENTION

Problem to be Solved by the Invention

In Patent Document 1, the side ground wire and the upper ground wire have a generally T-shape when viewed in cross-section, and the upper surface of the upper ground wire has a flat shape. Thus, the ground layer has excellent strength, and has excellent shape maintainability even when stress is applied to the ground layer. Accordingly, the adhesive properties of the ground layer with respect to the insulating layer are not easily reduced.

Meanwhile, the upper surface of the upper ground wire may have a recessed portion that is recessed downwardly corresponding to the opening portion in the insulating layer in accordance with the uses and purposes of the wiring circuit board. In this case, there is a disadvantage that the strength of the ground layer is low caused by the recessed portion, and thus, when the stress is applied to the ground layer, the upper ground wire easily shrinks in a plane direction, so that the adhesive properties of the upper ground wire with respect to the insulating layer, and furthermore, the adhesive properties of the side ground wire with respect to the lower ground wire are reduced.

Means for Solving the Problem

The inventors of the present application have found that the adhesive properties of a shield layer can be improved when the shield layer has an adhesive layer and a main body layer, and furthermore, when a ratio (Tb/Ta) of a thickness Tb of the main body layer to a thickness Ta of the adhesive layer is 4 or more as a result of keen examinations of a wiring circuit board having improved adhesive properties of the shield layer even with the shield layer having a recessed portion.

The present invention (1) includes a wiring circuit board sequentially including a conductive layer, an insulating layer, and a shield layer toward one side in a thickness direction, wherein the insulating layer covers the conductive layer and has an insulating opening portion exposing a part of a one-side surface in the thickness direction of the conductive layer; the shield layer has a recessed portion disposed at the inside of the insulating opening portion and recessed toward the other side in the thickness direction so as to be in contact with the conductive layer; the shield layer sequentially includes an adhesive layer and a main body layer toward one side in the thickness direction; and a ratio (Tb/Ta) of a thickness Tb of the main body layer to a thickness Ta of the adhesive layer is 4 or more.

In the wiring circuit board, the shield layer has the recessed portion, and even when stress is applied to the shield layer and it shrinks, the shield layer sequentially includes the adhesive layer and the main body layer toward one side in the thickness direction, and the ratio (Tb/Ta) of the thickness Tb of the main body layer to the thickness Ta of the adhesive layer is 4 or more, so that a reduction of the adhesive properties with respect to the insulating layer can be suppressed, and furthermore, a reduction of the adhesive properties with respect to a part of the conductive layer can be suppressed.

The present invention (2) includes the wiring circuit board described in (1), wherein the shield layer has a shield opening portion exposing a part of a one-side surface in the thickness direction of the insulating layer.

In the wiring circuit board, the shield layer has the shield opening portion, so that the shield opening portion is provided in a portion that does not require shielding of an electromagnetic wave, and in a portion other than the portion, the electromagnetic wave can be shielded by the shield layer.

The present invention (3) includes the wiring circuit board described in (1) or (2), wherein a material for the insulating layer is polyimide, a material for the adhesive layer is chromium, and a material for the main body layer is copper.

In the wiring circuit board, a reduction of the adhesive properties of the main body layer with respect to the insulating layer can be furthermore effectively suppressed by the adhesive layer.

The present invention (4) includes the wiring circuit board described in any one of (1) to (3) being a wiring circuit board for an imaging device.

The wiring circuit board is the wiring circuit board for an imaging device, so that an imaging device having excellent reliability can be produced.

The present invention (5) includes a wiring circuit board sequentially including a conductive layer, an insulating layer, and a shield layer toward one side in a thickness direction, wherein the shield layer has a shield opening portion exposing a part of a one-side surface in the thickness direction of the insulating layer.

In the wiring circuit board, the shield layer has the shield opening portion, so that the shield opening portion is provided in a portion that does not require the shielding of the electromagnetic wave, and in a portion other than die portion, the electromagnetic wave can be shielded by the shield layer.

The present invention (6) includes a method for producing a wiring circuit board including a first step of providing a conductive layer, a second step of providing an insulating layer so as to cover the conductive layer and have an insulating opening portion exposing a part of a one-side surface in a thickness direction of the conductive layer, and a third step of providing a shield layer on a one-side surface in the thickness direction of the insulating layer so as to have a recessed portion disposed at the inside of the insulating opening portion and recessed toward the other side in the thickness direction, wherein the third step includes a fourth step of providing an adhesive layer on the one-side surface in the thickness direction of the insulating layer, an inner-side surface of the insulating layer facing the insulating opening portion, and the one-side surface in the thickness direction of the conductive layer exposed from the insulating opening portion, and a fifth step of providing a main body layer on a one-side surface in the thickness direction of the adhesive layer, and a ratio (Tb/Ta) of a thickness Tb of the main body layer to a thickness Ta of the adhesive layer is 4 or more.

In the method for producing a wiring circuit board, the shield layer has the recessed portion, and even when the stress is applied to the shield layer and it shrinks, the shield layer sequentially includes the adhesive layer and the main body layer toward one side in the thickness direction, and the ratio (Tb/Ta) of the thickness Tb of the main body layer to the thickness Ta of the adhesive layer is 4 or more, so that a reduction of the adhesive properties with respect to the insulating layer can be suppressed, and furthermore, a reduction of the adhesive properties with respect to a part of the conductive layer can be suppressed.

When a thermal expansion coefficient of the adhesive layer is different from that of the insulating layer, by heating in the subsequent step, damage such as crack may be easily produced in the adhesive layer caused by a difference of the thermal expansion coefficient.

However, in the method for producing a wiring circuit board, the ratio (Tb/Ta) of the thickness Tb of the main body layer to the thickness Ta of the adhesive layer is 4 or more, so that the above-described damage caused by the difference of the thermal expansion coefficient can be suppressed.

The present invention (7) includes the method for producing a wiring circuit board described in (6), wherein in the third step, a shield opening portion exposing a part of the one-side surface in the thickness direction of the insulating layer is provided in the shield layer.

According to the producing method, by heating in the subsequent step, even when a gas is generated from the insulating layer, the gas can be efficiently emitted from the shield opening portion. Thus, the adhesive properties of the shield layer with respect to the insulating layer can be furthermore improved.

The present invention (8) includes the method for producing a wiring circuit board described in (6) or (7), wherein in the second step, the insulating layer is formed from polyimide, in the fourth step, the adhesive layer is formed from chromium, and in the fifth step, the main body layer is formed from copper.

In the method for producing a wiring circuit board, a reduction of the adhesive properties of the main body layer with respect to the insulating layer can be furthermore effectively suppressed by the adhesive layer.

The thermal expansion coefficient of the polyimide is remarkably different from that of the chromium, while being similar to that of the copper. Thus, the adhesive layer cannot follow elongation of the insulating layer and the main body layer by heating in the subsequent step, and the damage such as crack may be easily produced in the adhesive layer.

However, according to the producing method, the ratio (Tb/Ta) of the thickness Tb of the main body layer to the thickness Ta of the adhesive layer is 4 or more, so that excellent adhesive properties of the shield layer with respect to the insulating layer can be ensured.

The present invention (9) includes the method for producing a wiring circuit board described in any one of (6) to (8) being a method for producing a wiring circuit board for an imaging device.

The method for producing a wiring circuit board is the method for producing a wiring circuit board for an imaging device, so that an imaging device having excellent reliability can be produced from the obtained wiring circuit board.

The present invention (10) includes a method for producing a wiring circuit board including a first step of providing a conductive layer, a second step of providing an insulating layer so as to cover the conductive layer, and a third step of providing a shield layer on a one-side surface in a thickness direction of the insulating layer, wherein in the third step, a shield opening portion exposing a part of the one-side surface in the thickness direction of the insulating layer is provided in the shield layer.

In the method for producing a wiring circuit board, the shield layer has the shield opening portion, so that the shield opening portion can be provided in a portion that does not require the shielding of the electromagnetic wave.

Furthermore, according to the producing method, by heating in the subsequent step, even when a gas is generated from the insulating layer, the gas can be efficiently emitted from the shield opening portion. Thus, the adhesive properties of the shield layer with respect to the insulating layer can be furthermore improved.

Effect of the Invention

In the wiring circuit board and the method for producing a wiring circuit board of the present invention, a reduction of the adhesive properties with respect to the insulating layer can be suppressed.

In the wiring circuit board and the method for producing a wiring circuit board of the present invention, the shield opening portion can be provided in the portion that does not require the shielding of the electromagnetic wave.

BRIEF DESCRIPTION OF THE DRAWINGS

FIG. 1A illustrating a partially enlarged plan view and

FIG. 1B illustrating a cross-sectional view along an A-A line (circle is a partially enlarged view) of FIG. 1A.

FIGS. 2A to 2C show process views for illustrating a method for producing a wiring circuit board shown in FIG. 1B:

FIG. 2A illustrating a step of providing a base insulating layer,

FIG. 2B illustrating a first step of providing a conductive layer, and

FIG. 2C illustrating a second step of providing an intermediate insulating layer.

FIG. 3D illustrating a third step of providing a shield layer and

FIG. 3E illustrating a step of providing a cover insulating layer.

DESCRIPTION OF EMBODIMENTS

One Embodiment of Wiring Circuit Board and Producing Method Thereof

Figure 1A:
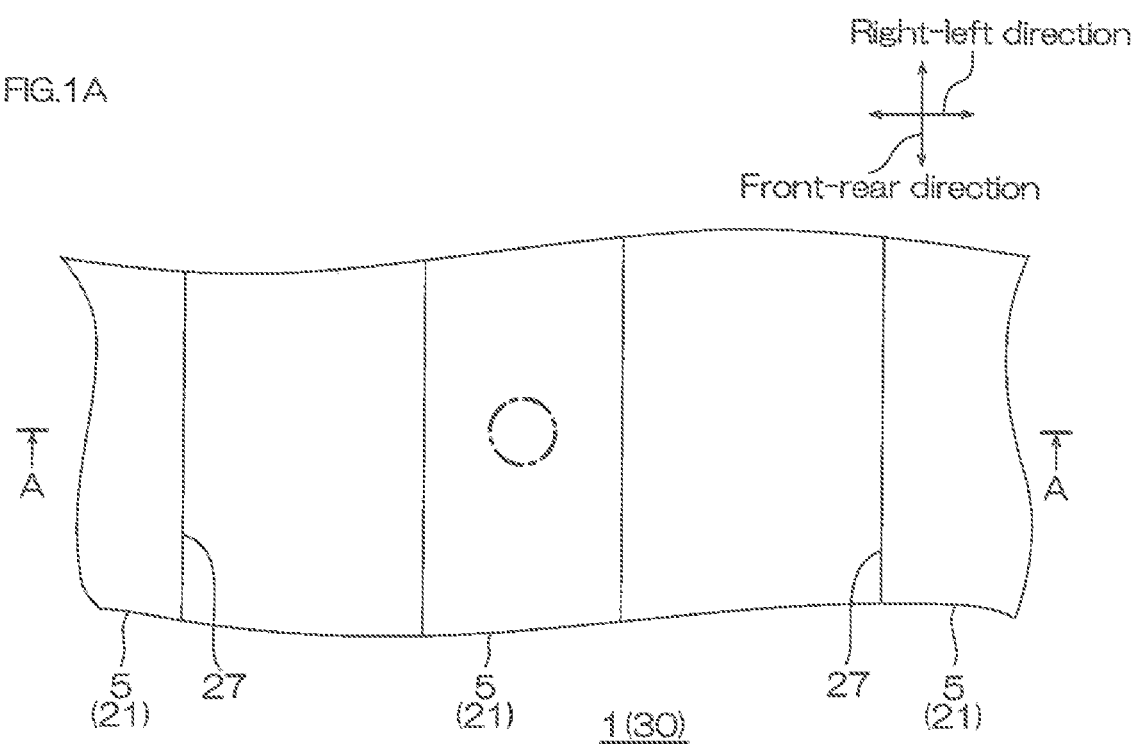
FIGS. 1A and 1B show a one embodiment of a wiring circuit board of the present invention.
Figure 1B:
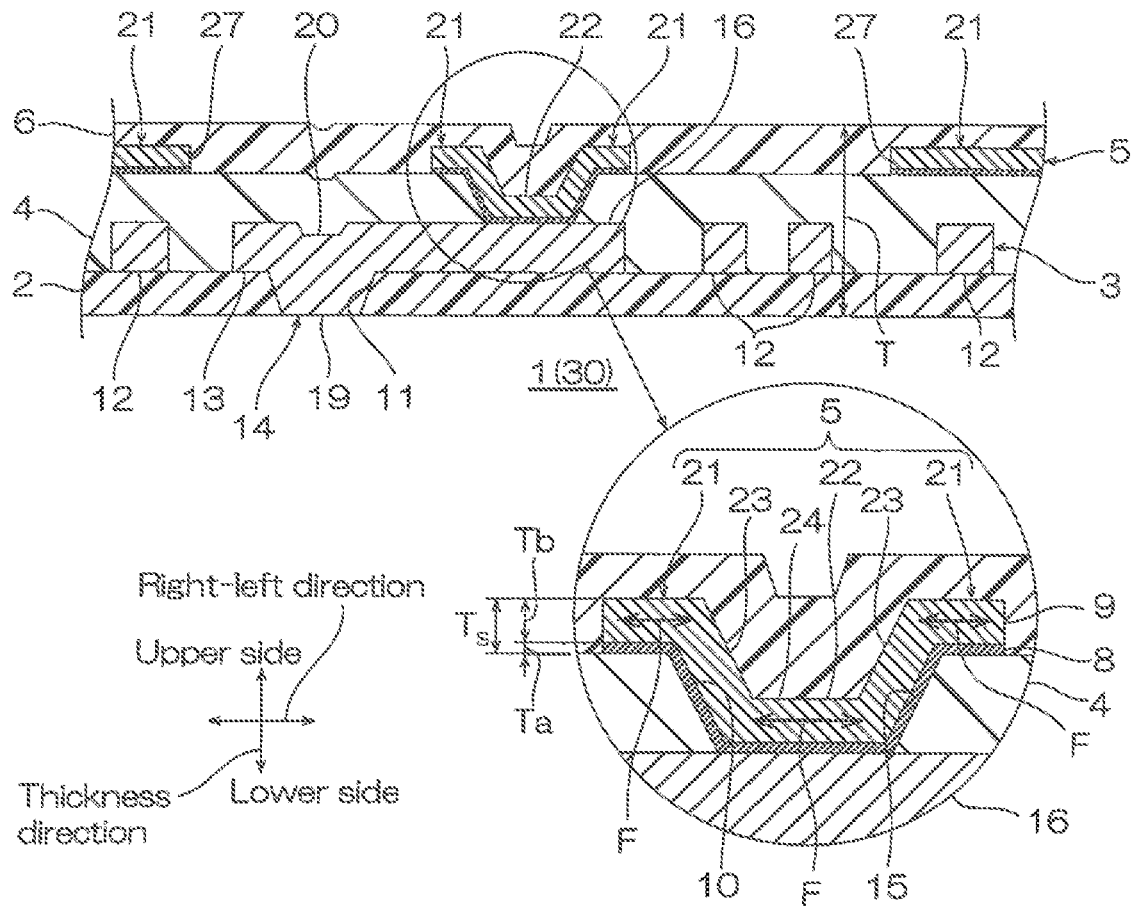

In FIGS. 1A and 1B, the right-left direction on the plane of the sheet shows a right-left direction (first direction). In FIG. 1B, the up-down direction on the plane of the sheet shows an up-down direction (one example of a thickness direction) (second direction perpendicular to the first direction), the upper side on the plane of the sheet shows an upper side (one example of one side in the thickness direction) (one side in the second direction), and the lower side on the plane of the sheet shows a lower side (the other side in the thickness direction) (the other side in the second direction). In FIG. 1A, the up-down direction on the plane of the sheet shows a front-rear direction (third direction perpendicular to the first direction and the second direction).

To be specific, directions are in conformity with direction arrows described in each view.

The definition of the directions does not mean to limit the direction of a wiring circuit board 1 and an imaging device 30 (described later) at the time of its production and its use.

In FIG. 1A, a cover insulating layer 6 (described later) is omitted to clearly show the arrangement and the shape of a shield layer 5 (described later).

In the following each of the views, an angle, a size, or the like of each member may be exaggeratedly illustrated and may be not accurately shown so as to easily understand the present invention.

As shown in FIGS. 1A and 1B, the wiring circuit board 1 has a predetermined thickness T, and has a sheet shape extending in a plane direction (both of the right-left direction and the front-rear direction). The wiring circuit board 1 is a wiring circuit board for an imaging device for being electrically connected to an imaging element (not shown) that is disposed at the lower side thereof to be provided (installed) in an imaging device (not shown).

The wiring circuit board 1 sequentially includes a base insulating layer 2, a conductive layer 3, an intermediate insulating layer 4 as one example of an insulating layer, the shield layer 5, and the cover insulating layer 6 upwardly.

The base insulating layer 2 has a sheet shape extending in the plane direction. The base insulating layer 2 forms the lower surface of the wiring circuit board 1. The base insulating layer 2 has a base opening portion 11 passing through in the thickness direction.

A material for the base insulating layer 2 is an insulating material. Examples of the insulating material include synthetic resins such as polyimide, polyamide imide, acryl, polyether nitrile, polyether sulfone, polyethylene terephthalate, polyethylene naphthalate, and polyvinyl chloride. Preferably, polyimide is used.

The base insulating layer 2 has a thermal expansion coefficient of, for example, 10 (ppm/K) or more, preferably 15 (ppm/K) or more, and for example, 50 (ppm/K) or less. The thermal expansion coefficient of the base insulating layer 2 is a linear thermal expansion coefficient in the plane direction, and can be, for example, measured by thermomechanical analysis under the conditions of JIS K 7197.

The base insulating layer 2 has a thickness of, for example, 1 μm or more, preferably 5 μm or more, and for example, 30 μm or less, preferably 10 μm or less.

The conductive layer 3 is disposed on the base insulating layer 2. The conductive layer 3 has a plurality of patterns disposed at spaced intervals to each other in the plane direction. To be specific, the conductive layer 3 independently includes signal layers 12 that are electrically connected to the imaging element (not shown) and a ground layer 13.

The plurality of signal layers 12 are disposed on the upper surface of the base insulating layer 2 at spaced intervals to each other in the plane direction. The signal layers 12 are electrically connected to the imaging element (described later, not shown).

The ground layer 13 integrally includes a ground contact portion 14 and an extending portion 16 that extends from the ground contact portion 14 in the plane direction.

The ground contact portion 14 is positioned at the inside of the base opening portion 11 when projected in the thickness direction, and extends in the up-down direction. The ground contact portion 14 includes a ground lower portion 19 that fills the base opening portion 11 and a ground upper portion 20 that is continuously provided at the upper side of the ground lower portion 19.

The extending portion 16 is uniformly formed with the ground upper portion 20. The extending portion 16 is disposed next to the ground contact portion 14 when projected in the thickness direction.

Examples of a material for the conductive layer 3 include metal materials such as copper, silver, gold, nickel, alloy including these, and solder. Preferably, copper is used. The conductive layer 3 has a thickness of 1 μm or more, preferably 3 μm or more, and for example, 15 μm or less, preferably 10 μm or less.

The intermediate insulating layer 4 has a sheet shape extending in the plane direction. The intermediate insulating layer 4 is disposed on the upper surface of the base insulating layer 2 so as to cover the conductive layer 3. To be specific, the intermediate insulating layer 4 covers the signal layer 12, the ground upper portion 20, and the extending portion 16. The intermediate insulating layer 4 has an intermediate opening portion 15 that exposes a part of the upper surface of the extending portion 16 as one example of an insulating opening portion.

The intermediate opening portion 15 passes through the intermediate insulating layer 4 (the upper-side portion with respect to the extending portion 16 in the intermediate insulating layer 4) in the thickness direction. The intermediate opening portion 15 has a tapered shape in which the opening cross-sectional area (the opening cross-sectional area when cut along the plane direction) decreases as it is closer to the lower side. An inner-side surface 10 of the intermediate insulating layer 4 that defines the intermediate opening portion 15 has a cylindrical shape extending along the thickness direction. To be more specific, in front cross-sectional view (when cut along the thickness direction and the right-left direction), the inner-side surface 10 is a tapered surface (inclined surface) facing each other in the right-left direction, and is formed so that a facing distance decreases as it is closer to the lower side. That is, the intermediate opening portion 15 has a generally truncated cone shape in which a size thereof decreases downwardly.

A material for the intermediate insulating layer 4 is the same as that for the base insulating layer 2. The thickness of the intermediate insulating layer 4 is a distance between the upper surface of the base insulating layer 2 and the upper surface of the intermediate insulating layer 4, and is, for example, 1 μm or more, preferably 5 μm or more, and for example, 30 μm or less, preferably 10 μm or less.

A maximum length (maximum size) of the upper end edge of the intermediate opening portion 15 is, for example, 10 μm or more, preferably 50 μm or more, and for example, 2000 μm or less, preferably 1500 μm or less. A maximum length (maximum size) of the lower end edge of the intermediate opening portion 15 is, for example, 10 μm or more, preferably 50 μm or more, and for example, 2000 μm or less, preferably 1500 μm or less. An angle α made between the inner-side surface 10 and the upper surface of the extending portion 16 that is exposed from the intermediate opening portion 15 is, for example, 90 degrees or more, preferably 120 degrees or more, and for example, 170 degrees or less, preferably 160 degrees or less.

The shield layer 5 is a layer that shields an electromagnetic wave from the outside. The shield layer 5 is disposed at the upper side with respect to the conductive layer 3. The shield layer 5 has a sheet shape extending in the front-rear direction. To be specific, the plurality of shield layers 5 are disposed at spaced intervals to each other in the right-left direction. In this manner, shield opening portions 27 are provided between the shield layers 5 that are next to each other. The plurality of shield opening portions 27 are provided at spaced intervals to each other in the right-left direction, and each of the shield opening portions 27 exposes a part of the upper surface of the intermediate insulating layer 4. The shield layer 5 has a pattern in which the above-described shield opening portion 27 is provided, and the intermediate opening portion 15 is included.

The area ratio of the shield opening portion 27 in the shield layer 5 is, for example, 1% or more, preferably 10% or more, and for example, 90% or less, preferably 70% or less.

The shield layer 5 includes a flat portion 21 and a recessed portion 22.

The flat portion 21 is disposed on the upper surface of the intermediate insulating layer 4. The flat portion 21 has a pattern surrounding the intermediate opening portion 15. The flat portion 21 has a sheet shape having a predetermined thickness and extending in the plane direction.

The recessed portion 22 is disposed at the inside of the intermediate opening portion 15, and has a shape that is recessed downwardly from the inner end edge of the flat portion 21 on the periphery of the intermediate opening portion 15. The recessed portion 22 has a generally U-shape when viewed in cross-section that is continuously disposed on the inner-side surface 10 and the upper surface of the extending portion 16 that is exposed from the intermediate opening portion 15. The recessed portion 22 integrally includes side walls 23 and a second flat portion 24.

The side wall 23 is an inclined wall that inclines downwardly (to be specific, obliquely downward and inward) from the inner end edge of the recessed portion 22 on the periphery of the intermediate opening portion 15. The side wall 23 has a generally truncated cone cylinder shape (truncated cone shape with the inside hollow) in which a size thereof decreases downwardly. The side wall 23 covers the inner-side surface 10.

The second flat portion 24 is a bottom wall that connects the lower end edges of the side walls 23. The second flat portion 24 is in contact with the upper surface of the extending portion 16 that is exposed from the intermediate opening portion 15. The second flat portion 24 has a shape corresponding to the lower end edge of the inner-side surface 10, to be specific, a generally circular shape when viewed from the top.

The thickness of the flat portion 21, the thickness of the side wall 23, and the thickness of the second flat portion 24 are generally the same, and a thickness Ts of the shield layer 5.

The shield layer 5 sequentially includes an adhesive layer 8 and a main body layer 9 upwardly. The shield layer 5 is a laminate of the adhesive layer 8 and the main body layer 9. Preferably, the shield layer 5 consists of only the adhesive layer 8 and the main body layer 9. To be more specific, in the shield layer 5, each of the flat portion 21 and the recessed portion 22 (the side wall 23 and the second flat portion 24) includes the adhesive layer 8 and the main body layer 9.

In the flat portion 21, the main body layer 9 is in tight contact with the upper surface of the intermediate insulating layer 4 via the adhesive layer 8.

In the recessed portion 22, the main body layer 9 is in tight contact with the inner-side surface 10 of the intermediate insulating layer 4 via the adhesive layer 8, and is in tight contact with the upper surface of the extending portion 16 that is exposed from the intermediate opening portion 15.

A material for the adhesive layer 8 is selected so that an adhesive force of the adhesive layer 8 with respect to the intermediate insulating layer 4 and the adhesive force of the adhesive layer 8 with respect to the main body layer 9 are larger than the adhesive force of the main body layer 9 with respect to the intermediate insulating layer 4. Examples of the material for the adhesive layer 8 include chromium and nickel. Preferably, chromium is used. When the material for the adhesive layer 8 is the chromium, the adhesive properties of the main body layer 9 with respect to the intermediate insulating layer 4 and the adhesive properties of the main body layer 9 with respect to the extending portion 16 that is exposed from the intermediate opening portion 15 can be furthermore increased.

The thermal expansion coefficient of the adhesive layer 8 is, for example, different from that of the intermediate insulating layer 4. To be specific, the thermal expansion coefficient of the adhesive layer 8 is smaller than that of the intermediate insulating layer 4, and to be more specific, is, for example, 90% or less, preferably 75% or less, more preferably 50% or less, further more preferably 45% or less, and for example, 10% or more, preferably 20% or more with respect to the thermal expansion coefficient of the intermediate insulating layer 4.

When a percentage of the thermal expansion coefficient of the adhesive layer 8 with respect to that of the intermediate insulating layer 4 is the above-described upper limit or less, the adhesive layer 8 does not easily follow elongation of the intermediate insulating layer 4 in the plane direction by heating in the production step to be described later, and damage such as crack is easily produced in the adhesive layer 8. However, in the method for producing the wiring circuit board 1 (described later), as described later, a ratio (Tb/Ta) of a thickness Tb of the main body layer 9 to a thickness Ta of the adhesive layer 8 is 4 or more, so that the damage of the adhesive layer 8 can be suppressed.

To be specific, the adhesive layer 8 has a thermal expansion coefficient of, for example, below 10 (ppm/K), preferably 9 (ppm/K) or less, more preferably 8 (ppm/K) or less, and for example, 1 (ppm/K) or more.

The thickness Ta of the adhesive layer 8 is set so as to satisfy the ratio (Tb/Ta) to be described later of the thickness Tb of the main body layer 9 to the thickness Ta of the adhesive layer 8, and to be specific, is, for example, below 100 nm, preferably 50 nm or less, more preferably 40 nm or less, further more preferably 30 nm or less, and for example, 2 nm or more.

A material for the main body layer 9 is selected so that the adhesive force of the adhesive layer 8 with respect to the main body layer 9 is larger than the adhesive force of the main body layer 9 with respect to the intermediate insulating layer 4. The material for the main body layer 9 may be, for example, the same as or different from that for the adhesive layer 8, and is preferably different from that for the adhesive layer 8. To be specific, examples of the material for the main body layer 9 include metals such as copper, chromium, nickel, gold, silver, platinum, palladium, titanium, tantalum, and solder or an alloy thereof. Preferably, copper and nickel are used, more preferably, copper is used.

The thermal expansion coefficient of the main body layer 9, for example, approximates that of the intermediate insulating layer 4. The thermal expansion coefficient of the main body layer 9 with respect to that of the intermediate insulating layer 4 is, for example, 70% or more, preferably 80% or more, more preferably 90% or more, further more preferably 95% or more, and for example, 110% or less, preferably 100% or less.

When the percentage of the thermal expansion coefficient of the main body layer 9 with respect to that of the intermediate insulating layer 4 is the above-described upper limit or less and the above-described lower limit or more, the thermal expansion coefficient of the main body layer 9 approximates that of the intermediate insulating layer 4, so that even when the thermal expansion coefficient of the adhesive layer 8 is remarkably different from that of the intermediate insulating layer 4, the elongation of the intermediate insulating layer 4 and that of the adhesive layer 8 match by heating in the production step to be described later, and the damage of the adhesive layer 8 can be suppressed.

To be specific, the main body layer 9 has a thermal expansion coefficient of, for example, 10 (ppm/K) or more, preferably 13 (ppm/K) or more, more preferably 15 (ppm/K) or more, and for example, 20 (ppm/K) or less.

The thickness Tb of the main body layer 9 is set so as to satisfy the ratio (Tb/Ta) to be described later, and to be specific, is for example, 50 nm or more, preferably 100 nm or more, more preferably 110 nm or more, and for example, 250 nm or less, preferably 200 nm or less.

The ratio (Tb/Ta) of the thickness Tb of the main body layer 9 to the thickness Ta of the adhesive layer 8 is, for example, 4 or more, preferably 5 or more, and for example, 20 or less, preferably 10 or less.

When the ratio (Tb/Ta) is below the above-described lower limit, the adhesive properties of the shield layer 5 cannot be improved. In other words, in the one embodiment, the ratio (Tb/Ta) is the above-described lower limit or more, so that the adhesive properties of the shield layer 5 can be improved.

As the details are described below, when the ratio (Tb/Ta) is the above-described lower limit or more, the adhesive layer 8 is sufficiently thin compared to the main body layer 9. Thus, the adhesive layer 8 can follow the intermediate insulating layer 4 and the main body layer 9, and the damage of the adhesive layer 8 can be suppressed. When the ratio (Tb/Ta) is the above-described lower limit or more, the main body layer 9 is sufficiently thick compared to the adhesive layer 8. Thus, the main body layer 9 can sufficiently push the adhesive layer 8, so that the damage of the adhesive layer 8 can be suppressed.

The shield layer 5 has the thickness Ts of, for example, 60 nm or more, preferably 100 nm or more, and for example, 3000 nm or less, preferably 1000 nm or less. The thickness Ts of the shield layer 5 is the total sum (Ta+Tb) of the thickness Ta of the adhesive layer 8 and the thickness Tb of the main body layer 9.

The cover insulating layer 6 has a sheet shape extending in the plane direction. The cover insulating layer 6 forms the upper surface of the wiring circuit board 1. The cover insulating layer 6 is disposed on the upper surface of the intermediate insulating layer 4 so as to cover the shield layer 5. The cover insulating layer 6 fills the recessed portion 22. A material for the cover insulating layer 6 is the same as that for the base insulating layer 2. The thermal expansion coefficient of the cover insulating layer 6 is the same as that of the base insulating layer 2. The thickness of the cover insulating layer 6 is not particularly limited, and is, for example, 1 μm or more, preferably 5 μm or more, and for example, 30 μm or less, preferably 10 μm or less.

The thickness T of the wiring circuit board 1 is the total sum of the thickness of the base insulating layer 2, the intermediate insulating layer 4, and the cover insulating layer 6, and to be specific, is a distance between the lower surface of the base insulating layer 2 and the upper surface of the cover insulating layer 6. To be specific, the wiring circuit board 1 has the thickness T of, for example, 5 μm or more, preferably 10 μm or more, and for example, 100 μm or less, preferably 50 μm or less.

Next, the method for producing the wiring circuit board 1 is described.

As shown in FIGS. 2A to 3E and 1B, the method for producing the wiring circuit board 1 sequentially includes a step of providing the base insulating layer 2 on a supporting board 25, a first step of providing the conductive layer 3, a second step of providing the intermediate insulating layer 4, a third step of providing the shield layer 5, a step of providing the cover insulating layer 6, and a step of removing the supporting board 25.

As shown in FIG. 2A, in the step of providing the base insulating layer 2, first, the supporting board 25 is prepared.

The supporting board 25 has a sheet shape extending in the plane direction and having the flat upper surface. Examples of a material for the supporting board 25 include metals such as stainless steel, 42-alloy, and aluminum; resins; and ceramics. Preferably, a metal is used. The supporting board 25 has a thickness of, for example, 5 μm or more, preferably 10 μm or more, and for example, 50 μm or less, preferably 30 μm or less.

To provide the base insulating layer 2 on the supporting board 25, for example, the base insulating layer 2 having the base opening portion 11 is formed from an insulating material on the upper surface of the supporting board 25 by photo-processing. Or, the base insulating layer 2 in which the base opening portion 11 is formed in advance is disposed (placed) on the upper surface of the supporting board 25.

In this manner, the base insulating layer 2 is provided on the upper surface of the supporting board 25.

As shown in FIG. 23, next, in the first step, the conductive layer 3 is provided on the base insulating layer 2. To be specific, the conductive layer 3 is formed from the signal layer 12 and the ground layer 13 by, for example, a pattern forming method such as additive method and subtractive method.

As shown in FIG. 2C, next, in the second step, the intermediate insulating layer 4 is provided so as to cover the conductive layer 3 and have the intermediate opening portion 15 that exposes a part of the upper surface of the extending portion 16.

The intermediate insulating layer 4 having the intermediate opening portion 15 is, for example, formed from the insulating material on the entire upper surface of the base insulating layer 2 and the upper surface and the side surfaces of the conductive layer 3 by the photo-processing. Or, the intermediate insulating layer 4 in which the intermediate opening portion 15 is formed in advance is disposed (placed) on the base insulating layer 2 and the conductive layer 3.

In this manner, in the second step, the intermediate insulating layer 4 is provided so as to cover the conductive layer 3 (excluding a part of the extending portion 16) and have the intermediate opening portion 15.

Figure 3D:
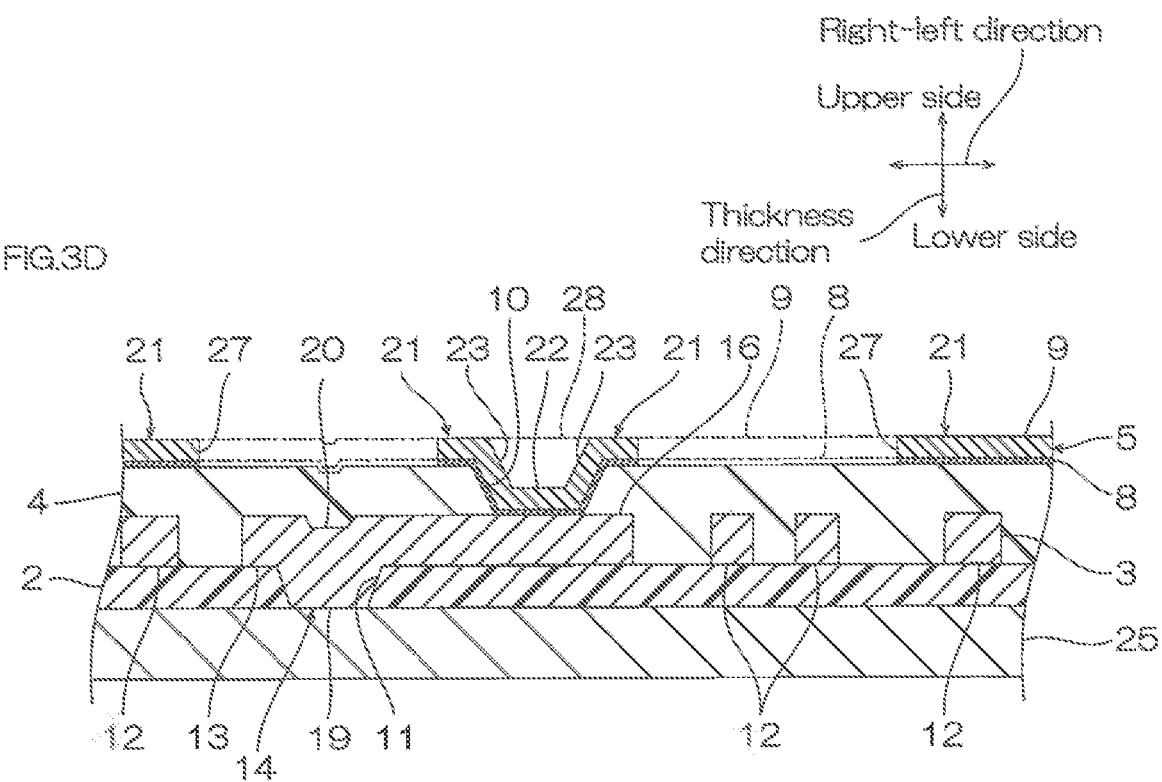
FIGS. 3D to 3E, subsequent to FIG. 2C, show process views for illustrating the method for producing a wiring circuit board shown in FIG. 1B.

As shown in FIG. 3D, in the third step, the shield layer 5 is provided on the upper surface of the intermediate insulating layer 4 so as to have the recessed portion 22 that is disposed at the inside of the intermediate opening portion 15 and is recessed downwardly.

In the third step, the adhesive layer 8 is, for example, formed by a thin film forming method such as sputtering and plating (electroless plating or the like) (fourth step), and subsequently, the main body layer 9 is formed (fifth step), so that the shield layer 5 is formed from the adhesive layer 8 and the main body layer 9. Preferably, the shield layer 5 is formed by sputtering. In the sputtering, the shield layer 5 having a uniform thickness (to be specific, the adhesive layer 8 having a uniform thickness and the main body layer 9 having a uniform thickness) can be formed.

The method for forming the adhesive layer 8 and the method for forming the main body layer 9 may be the same as or different from each other, and preferably the same.

Preferably, each of the adhesive layer 8 and the main body layer 9 is formed by the sputtering. That is, the adhesive layer 8 is formed by the sputtering (fourth step), and subsequently, the main body layer 9 is formed on the upper surface of the adhesive layer 8 by the sputtering (fifth step).

Thereafter, the shield opening portion 27 is, for example, formed in the shield layer 5 by the thin film removing method such as etching (dry etching, wet etching).

Figure 3E:
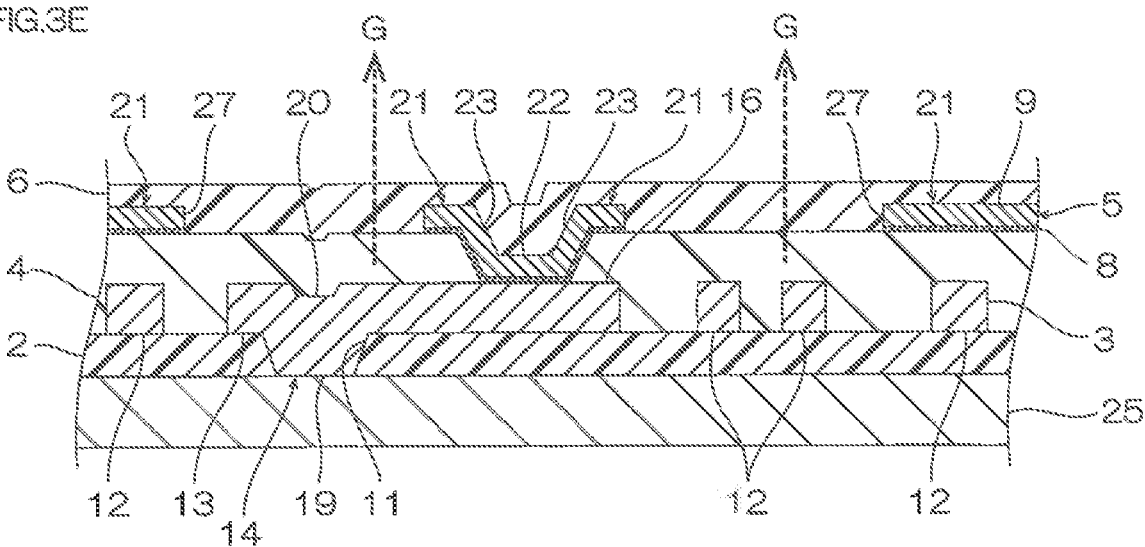

As shown in FIG. 3E, next, the cover insulating layer 6 is provided on the upper surface of the intermediate insulating layer 4 and the upper surface and the side surfaces of the shield layer 5.

The cover insulating layer 6 is, for example, provided by the photo-processing. To be specific, in the photo-processing, first, a photosensitive insulating composition containing a photosensitive component and an insulating material is prepared, and subsequently, the photosensitive insulating composition is applied to the upper surface of the intermediate insulating layer 4 and the upper surface and the side surfaces of the shield layer 5 to be then dried as needed, so that a film is formed. Next, the film is exposed to light via a photomask to be developed, so that the cover insulating layer 6 is formed. Thereafter, the cover insulating layer 6 is heated (heated after exposure to light). The heating conditions are, for example, the conditions in which the insulating material can be sufficiently cured (to be specific, imidized), and to be specific, the temperature is, for example, 250° C. or more, preferably 300° C. or more, and for example, 400° C. or less, and the time is, for example, 10 minutes or more, preferably 30 minutes or more, and for example, 100 minutes or less.

Or, the cover insulating layer 6 that is formed in a predetermined pattern in advance is disposed (placed) on the intermediate insulating layer 4 and the shield layer 5.

Preferably, the photo-processing is used in view of reliable pattern forming and arrangement.

As shown in FIG. 1B, thereafter, the supporting board 25 is removed from the lower surface of the base insulating layer 2 and the lower surface of the ground lower portion 19 by, for example, peeling or the like. The lower surface of the base insulating layer 2 and the lower surface of the ground lower portion 19 are exposed downwardly.

In this manner, the wiring circuit board 1 is produced.

Thereafter, an imaging element (not shown) is prepared at the lower side of the wiring circuit board 1, and the imaging element (not shown) is electrically connected to the signal layer 12. The ground contact portion 14 is electrically connected to an earth contact (not shown), and the ground layer 13 is grounded.

In this manner, the imaging device 30 including the wiring circuit board 1 and the imaging element (not shown) is obtained.

In the wiring circuit board 1, the shield layer 5 has the recessed portion 22, and even when stress F shown by an arrow F of FIG. 1B is applied to the shield layer 5 and the shield layer 5 attempts to shrink, the shield layer 5 sequentially includes the adhesive layer 8 and the main body layer 9 toward one side in the thickness direction, and the ratio (Tb/Ta) of the thickness Tb of the main body layer 9 to the thickness Ta of the adhesive layer 8 is 4 or more, so that a reduction of the adhesive properties with respect to the intermediate insulating layer 4 can be suppressed, and furthermore, a reduction of the adhesive properties with respect to a part of the extending portion 16 can be suppressed.

In the wiring circuit board 1, the shield layer 5 has the shield opening portion 27, so that the shield opening portion 27 is provided in a portion that does not require shielding of an electromagnetic wave, and in a portion other than the portion, the electromagnetic wave can be shielded by the shield layer 5.

In the wiring circuit board 1, when the material for the intermediate insulating layer 4 is the polyimide, the material for the adhesive layer 8 is the chromium, and the material for the main body layer 9 is the copper, a reduction of the adhesive properties of the main body layer 9 with respect to the intermediate insulating layer 4 can be furthermore effectively suppressed by the adhesive layer 8.

The wiring circuit board 1 is a wiring circuit board for an imaging device, so that the imaging device 30 having excellent reliability can be produced.

According to the method for producing the wiring circuit board 1, when the thermal expansion coefficient of the adhesive layer 8 is different from that of the intermediate insulating layer 4, by heating (heating after exposure to light) of the cover insulating layer 6 shown in FIG. 3E, damage such as crack may be easily produced in the adhesive layer 8 caused by a difference between the thermal expansion coefficient of the adhesive layer 8 and that of the intermediate insulating layer 4.

However, in the method for producing the wiring circuit board 1, the ratio (Tb/Ta) of the thickness Tb of the main body layer 9 to the thickness Ta of the adhesive layer 8 is 4 or more, so that the above-described damage caused by the difference of the thermal expansion coefficient can be suppressed.

The thermal expansion coefficient (17 (ppm/K)) of the polyimide is remarkably different from that (6.8 (ppm/K)) of the chromium, while being similar to that (16.8 (ppm/K)) of the copper. Thus, the adhesive layer 8 cannot follow elongation of the intermediate insulating layer 4 and the main body layer 9 by heating (heating after exposure to light) of the cover insulating layer 6 shown in FIG. 3E, and the damage such as crack may be easily produced in the adhesive layer 8.

However, according to the producing method, the ratio (Tb/Ta) of the thickness Tb of the main body layer 9 to the thickness Ta of the adhesive layer 8 is 4 or more, so that excellent adhesive properties of the shield layer 5 with respect to the intermediate insulating layer 4 can be ensured.

The method for producing the wiring circuit board 1 is the method for producing a wiring circuit board for an imaging device, so that the imaging device 30 having excellent reliability can be produced.

Modified Example

In the one embodiment, the wiring circuit board 1 is described as the wiring circuit board for an imaging device, and its use is not limited to this. Alternatively, for example, the wiring circuit board 1 can be also used for a board for inspection (anisotropic conductive sheet), a flexible wiring circuit board, or the like.

In the one embodiment, as shown in FIG. 1B, the intermediate opening portion 15 exposes a part of the upper surface of the extending portion 16. Alternatively, for example, though not shown, instead of this or along with this, (a part of the or the entire) upper surface of the ground upper portion 20 can be also exposed. In this case, the second flat portion 24 of the recessed portion 22 is in contact with the upper surface of the ground upper portion 20.

In the one embodiment, the shield opening portion 27 is formed in the shield layer 5.

Figure 4:
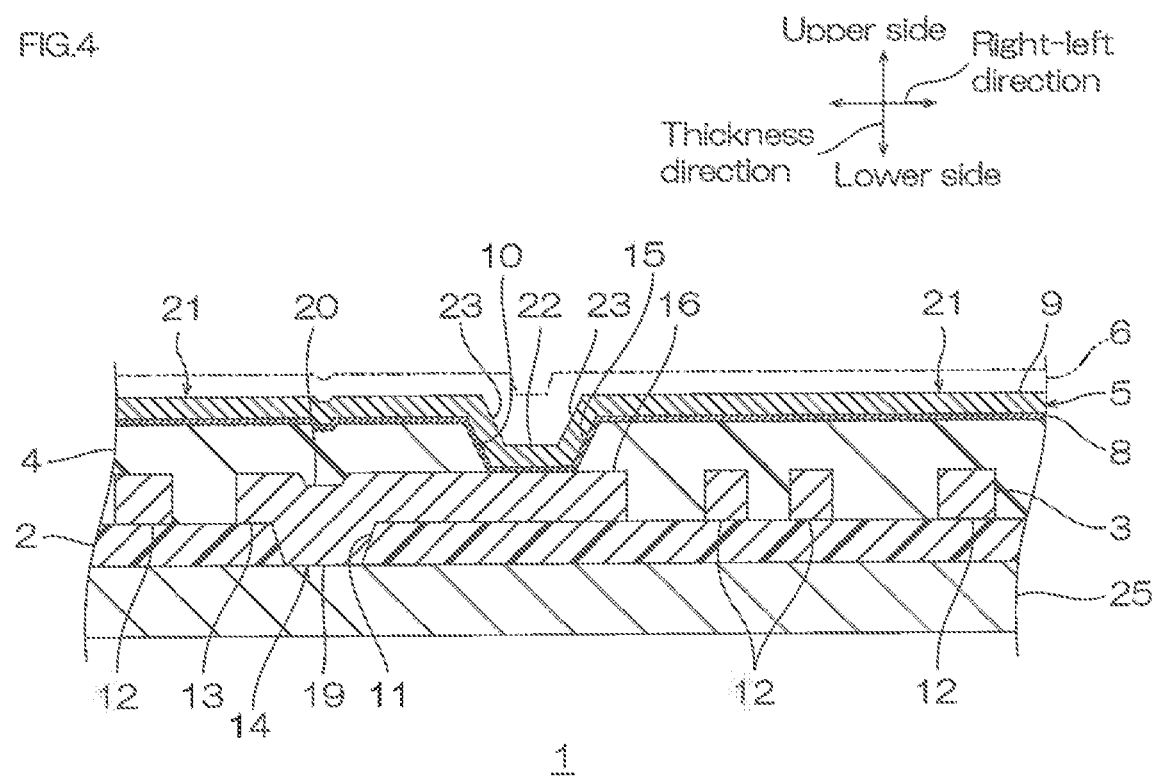
FIG. 4 shows a modified example of the wiring circuit board shown in FIG. 1B.

However, for example, as shown in FIG. 4, the shield layer 5 without having the shield opening portion 27 (ref: FIGS. 1A and 1B) can be also continuously formed on the entire upper surface of the intermediate insulating layer 4, the inner-side surface 10, and the upper surface of the extending portion 16 that is exposed from the intermediate opening portion 15.

As shown in FIG. 1B, preferably, the shield opening portion 27 is formed in the shield layer 5.

As shown in FIG. 4, when the shield opening portion 27 is not formed in the shield layer 5, even when a gas G (vapor or the like derived from moisture absorbed by the intermediate insulating layer 4) is generated from the intermediate insulating layer 4 by heating in the step shown in FIG. 3E, the shield layer 5 shields the gas G and thus, the damage such as deformation of the intermediate insulating layer 4 is produced. As a result, the adhesive properties of the adhesive layer 8 with respect to the intermediate insulating layer 4 are reduced.

However, as shown in FIG. 1B, when the shield opening portion 27 is formed in the shield layer 5, the above-described gas G can be efficiently emitted from the shield opening portion 27. Thus, the adhesive properties of the shield layer 5 with respect to the intermediate insulating layer 4 can be furthermore improved.

Figure 5:
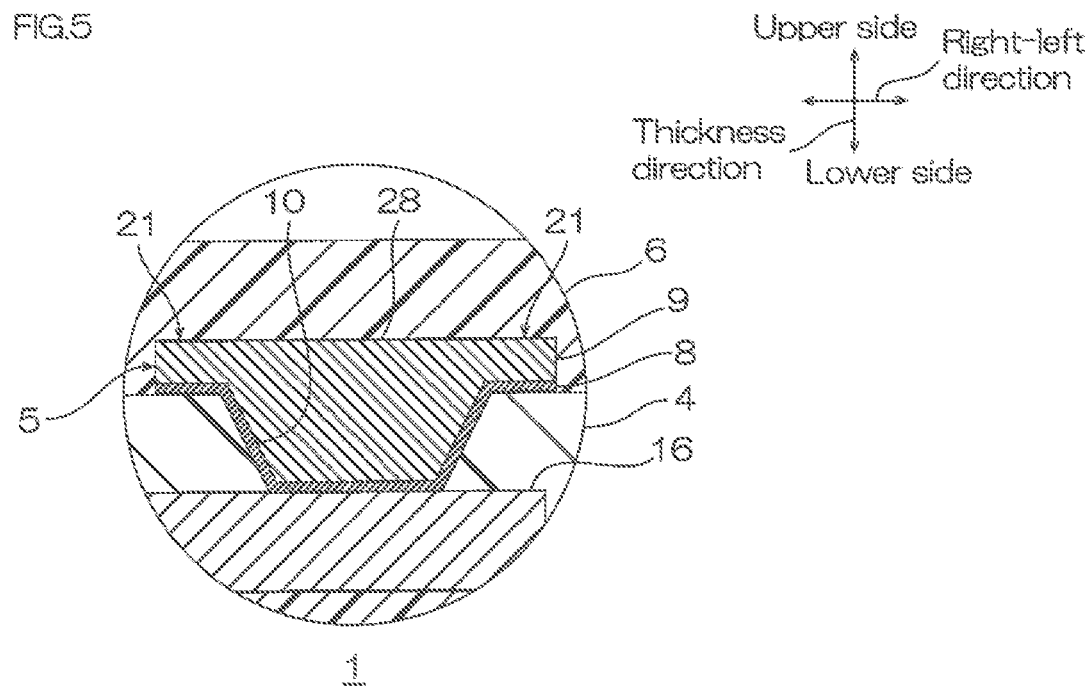
FIG. 5 shows a modified example of the wiring circuit board shown in FIG. 1B.

As shown in FIG. 5, for example, the shield layer 5 can be also constituted without providing the recessed portion 22. In this case, the shield layer 5 continuously has the flat portion 21 and a filling portion 28 that fills the intermediate opening portion 15, and the upper surfaces thereof have a flat shape. The upper surface of the shield layer 5 is parallel with the upper surface of the intermediate insulating layer 4. The filling portion 28 is solid, and has the flat upper surface.

According to the structure, the above-described gas G can be efficiently emitted via the shield opening portion 27.

Figure 6:
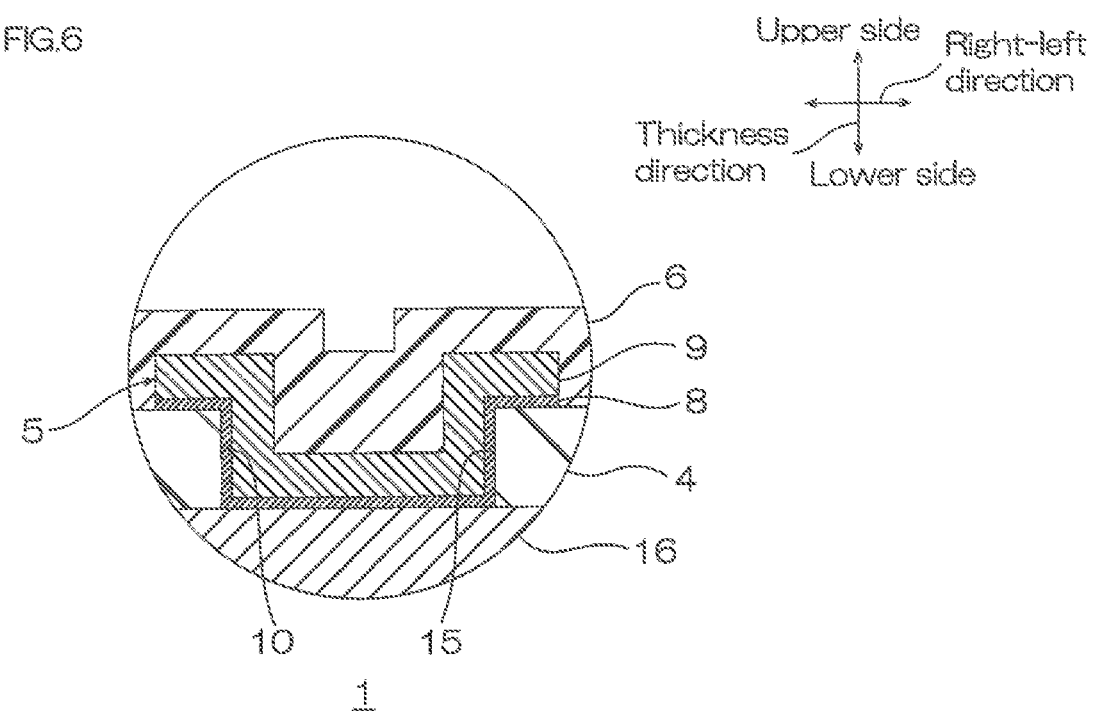
FIG. 6 shows a modified example of the wiring circuit board shown by the enlarged view of FIG. 1B.

In the one embodiment, as shown in FIG. 1B, the inner-side surface 10 has a tapered shape. Alternatively, for example, as shown in FIG. 6, the inner-side surface 10 can also have a straight shape along the thickness direction.

EXAMPLES

The specific numerical values in mixing ratio (content ratio), property value, and parameter used in the following description can be replaced with upper limit values (numerical values defined as "or less" or "below") or lower limit values (numerical values defined as "or more" or "above") of corresponding numerical values in mixing ratio (content ratio), property value, and parameter described in the above-described "DESCRIPTION OF EMBODIMENTS".

Example 1

As shown in FIG. 2A, the base insulating layer 2 made of polyimide was formed on the upper surface of the supporting board 25 made of stainless steel by photo-processing.

As shown in FIG. 2B, next, the conductive layer 3 independently including the signal layer 12 and the ground layer 13 and made of copper was formed on the upper surface of the base insulating layer 2 by an additive method (first step).

As shown in FIG. 2C, next, the intermediate insulating layer 4 having the intermediate opening portion 15 and made of polyimide (thermal expansion coefficient: 17 (ppm/K)) was formed on the upper surface of the base insulating layer 2 so as to cover the conductive layer 3 by the photo-processing (second step). The intermediate insulating layer 4 had a thickness of 10 μm.

As shown by a solid line and a phantom line of FIG. 3D, next, the adhesive layer 8 made of chromium (thermal expansion coefficient: 6.8 (ppm/K)) and having a thickness Ta of 30 μm was formed by a sputtering method (fourth step), and subsequently, the main body layer 9 made of copper (thermal expansion coefficient: 16.8 (ppm/K)) and having a thickness Tb of 120 μm was formed by the sputtering method (fifth step). In this manner, the shield layer 5 having the flat portion 21 and the recessed portion 22 was formed. The shield layer 5 did not have the shield opening portion 27 yet, that is, the adhesive layer 8 was continuously formed on the entire upper surface of the intermediate insulating layer 4, the inner-side surface 10 of the shield layer 5, and the upper surface of the extending portion 16 that was exposed from the intermediate opening portion 15. Also, the main body layer 9 was formed on the entire upper surface of the adhesive layer 8.

As shown by the solid line of FIG. 3D, subsequently, the shield layer 5 was formed in a pattern having the shield opening portion 27 by wet etching (third step).

As shown in FIG. 3F, thereafter, the cover insulating layer 6 was formed on the upper surface of the intermediate insulating layer 4 so as to cover the shield layer 5 by the photo-processing. To be specific, a photosensitive polyimide composition was applied to the upper surface of the intermediate insulating layer 4, and the upper surface and the side surfaces of the shield layer 5 to be then dried, so that a film was formed. Next, the film was exposed to light via a photomask to be developed, so that the cover insulating layer 6 was formed. Thereafter, the cover insulating layer 6 was heated at 325° C. for 20 minutes after exposure to light.

As shown in FIG. 1B, thereafter, the supporting board 25 was removed by peeling.

In this manner, the wiring circuit board 1 was produced.

Example 2 to Comparative Example 2

The wiring circuit board 1 was produced in the same manner as that in Example 1, except that the thickness Ta of the adhesive layer 8 and the thickness Tb of the main body layer 9 were changed in accordance with Table 1.

[Crack Observation of Adhesive Layer]

A presence or absence of an occurrence of a crack of the adhesive layer 8 was observed with an optical microscope. The results are shown in Table 1.

TABLE 1

|  | Ex. 1 | Ex. 2 | Ex. 3 | Comp. Ex. 1 | Comp. Ex. 2 | Comp. Ex. 3 | Comp. Ex. 4 |
|---|---|---|---|---|---|---|---|
| Thickness Ta of Adhesive Layer [mm] | 30 | 30 | 10 | 30 | 30 | 30 | 30 |
| Thickness Tb of Main Body Layer [mm] | 120 | 150 | 50 | 80 | 70 | 60 | 50 |
| Ratio (Tb/Ta) | 4 | 5 | 5 | 3 | 2.3 | 2 | 1.7 |
| Crack | Absence | Absence | Absence | Presence | Presence | Presence | Presence |

While the illustrative embodiments of the present invention are provided in the above description, such is for illustrative purpose only and it is not to be construed as limiting the scope of the present invention. Modification and variation of the present invention that will be obvious to those skilled in the art is to be covered by the following claims.

INDUSTRIAL APPLICABILITY

The wiring circuit board is used for the imaging device.

DESCRIPTION OF REFERENCE NUMERALS

1 Wiring circuit board (wiring circuit board for imaging device)
3 Conductive layer
4 Intermediate insulating layer
5 Shield layer
8 Adhesive layer
9 Main body layer
15 Intermediate opening portion
22 Recessed portion
30 Imaging device
Ta Thickness of adhesive layer
Tb Thickness of main body layer

The invention claimed is:

1. A wiring circuit board sequentially comprising:
a conductive layer, an insulating layer, a shield layer, and a cover insulating layer toward one side in a thickness direction, wherein
the insulating layer covers the conductive layer and has an insulating opening portion exposing a part of a one-side surface in the thickness direction of the conductive layer;
the shield layer has a recessed portion disposed at the inside of the insulating opening portion and recessed toward the other side in the thickness direction so as to be in contact with the conductive layer;
the shield layer sequentially includes an adhesive layer and a main body layer toward one side in the thickness direction;
a ratio (Tb/Ta) of a thickness Tb of the main body layer to a thickness Ta of the adhesive layer is 4 or more;
the thickness Tb of the main body layer is 250 nm or less; and
the cover insulating layer is in contact with a one-side surface in the thickness direction of the main body layer.

2. The wiring circuit board according to claim 1, wherein the shield layer has a shield opening portion exposing a part of a one-side surface in the thickness direction of the insulating layer.

3. The wiring circuit board according to claim 1, wherein a material for the insulating layer is polyimide,
a material for the adhesive layer is chromium, and
a material for the main body layer is copper.

4. The wiring circuit board according to claim 1 being a wiring circuit board for an imaging device.

5. A wiring circuit board sequentially comprising:
a conductive layer, an insulating layer, a shield layer, and a cover insulating layer toward one side in a thickness direction, wherein
the shield layer has a shield opening portion exposing a part of a one-side surface in the thickness direction of the insulating layer,
the shield layer sequentially includes an adhesive layer and a main body layer toward one side in the thickness direction,
a ratio (Tb/Ta) of a thickness Tb of the main body layer to a thickness Ta of the adhesive layer is 4 or more,
the thickness Tb of the main body layer is 250 nm or less, and
the cover insulating layer is in contact with a one-side surface in the thickness direction of the main body layer.

6. A wiring circuit board sequentially comprising:
a conductive layer, an insulating layer, a shield layer, and a cover insulating layer toward one side in a thickness direction, wherein
the insulating layer covers the conductive layer and has an insulating opening portion exposing a part of a one-side surface in the thickness direction of the conductive layer,
the shield layer has a recessed portion disposed at the inside of the insulating opening portion and recessed toward the other side in the thickness direction so as to be in contact with the conductive layer,
the shield layer sequentially includes an adhesive layer and a main body layer toward one side in the thickness direction,
a ratio (Tb/Ta) of a thickness Tb of the main body layer to a thickness Ta of the adhesive layer is 4 or more and 20 or less,
the cover insulating layer is in contact with a one-side surface in the thickness direction of the main body layer, and
the thickness Ta of the adhesive layer is 30 nm or less.

7. The wiring circuit board according to claim 6, wherein the shield layer has a shield opening portion exposing a part of the one-side surface in the thickness direction of the insulating layer.

8. The wiring circuit board according to claim 6, wherein
a material of the insulating layer is polyimide,
a material of the adhesive layer is chromium, and
a material of the main body layer is copper.

9. The wiring circuit board according to claim 6 and being a wiring circuit board for an imaging device.

10. A wiring circuit board sequentially comprising:
a conductive layer, an insulating layer, a shield layer, and a cover insulating layer toward one side in a thickness direction, wherein
the shield layer has a shield opening portion exposing a part of the one-side surface in the thickness direction of the insulating layer,
the shield layer sequentially includes an adhesive layer and a main body layer toward one side in the thickness direction,
a ratio (Tb/Ta) of a thickness Tb of the main body layer to a thickness Ta of the adhesive layer is 4 or more and 20 or less,
the cover insulating layer is in contact with a one-side surface in the thickness direction of the main body layer, and
the thickness Ta of the adhesive layer is 30 nm or less.

\* \* \* \* \*